(12) United States Patent
Jin et al.

(10) Patent No.: US 10,088,879 B2
(45) Date of Patent: Oct. 2, 2018

(54) INTELLIGENT TERMINAL HEAT DISSIPATION APPARATUS AND INTELLIGENT TERMINAL (71) Applicant: Huawei Technologies Co., Ltd., Shenzhen (CN)

(72) Inventors: Linfang Jin, Shenzhen (CN); Nanbo Kang, Shenzhen (CN); Jie Zou, Shenzhen (CN); Xiaowei Hui, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/508,890

(22) PCT Filed: Jun. 12, 2014

(86) PCT No.: PCT/CN2014/079725
§ 371 (c)(1),
(2) Date: Mar. 3, 2017

(87) PCT Pub. No.: WO2015/188343
PCT Pub. Date: Dec. 17, 2015

(65) Prior Publication Data
US 2017/0220082 A1 Aug. 3, 2017

(51) Int. Cl.
*G06F 1/20* (2006.01)
*F28D 15/02* (2006.01)
(Continued)

(52) U.S. Cl.
CPC .......... *G06F 1/203* (2013.01); *F28D 15/0241* (2013.01); *F28D 15/04* (2013.01); *H01L 23/427* (2013.01)

(58) Field of Classification Search
CPC ......... H01L 23/427; H01L 2224/48091; H01L 23/473; F28D 15/046; F28D 15/0233;
(Continued)

(56) References Cited

U.S. PATENT DOCUMENTS 6,474,074 B2    11/2002  Ghoshal
8,069,907 B2 *  12/2011  Bryant ................ F28D 15/0241
                                              165/104.33
(Continued)

FOREIGN PATENT DOCUMENTS

CN    1355415 A    6/2002
CN    2831018 Y    10/2006
(Continued)

*Primary Examiner* — Adam B Dravininkas
(74) *Attorney, Agent, or Firm* — Leydig, Voit & Mayer, Ltd.

(57) ABSTRACT

An intelligent terminal heat dissipation apparatus and an intelligent terminal are disclosed. The intelligent terminal heat dissipation apparatus includes at least one flexible heat pipe, where two ends of the flexible heat pipe are condensation ends, the middle of the flexible heat pipe is an evaporation end, the condensation end includes one or more heat pipe rigid parts and one or more heat pipe flexible parts, the one or more heat pipe rigid parts and the one or more heat pipe flexible parts of the condensation end are arranged alternately, the evaporation end includes at least one heat pipe rigid part, and an intelligent terminal body is mounted on the evaporation end. By using the intelligent terminal heat dissipation apparatus, flexible heat dissipation is implemented for a bendable device.

10 Claims, 4 Drawing Sheets (51) Int. Cl.
*H01L 23/427* (2006.01)
*F28D 15/04* (2006.01)

(58) Field of Classification Search
CPC .. F28D 15/0275; F28D 15/0266; F28D 15/04; F28D 15/02; F28D 15/043; F28D 15/0241; F28D 15/00; F28D 2021/0028
See application file for complete search history.

(56) References Cited

U.S. PATENT DOCUMENTS

| | | | | |
|---|---|---|---|---|
| 8,230,907 | B2* | 7/2012 | Thayer | F28D 15/046 165/104.26 |
| 2005/0180109 | A1* | 8/2005 | Miyazaki | F28D 15/0241 361/700 |
| 2006/0086482 | A1* | 4/2006 | Thayer | F28D 15/0241 165/104.26 |
| 2007/0258213 | A1* | 11/2007 | Chen | F28D 15/0233 361/701 |
| 2008/0092973 | A1* | 4/2008 | Lai | F16L 11/11 138/118 |
| 2008/0099186 | A1* | 5/2008 | Yu | F28D 15/0241 165/104.11 |
| 2008/0170368 | A1* | 7/2008 | Chen | F28D 15/0233 361/701 |
| 2011/0088874 | A1* | 4/2011 | Meyer, IV | F28D 15/046 165/104.26 |
| 2011/0220328 | A1 | 9/2011 | Huang et al. | |
| 2012/0111537 | A1* | 5/2012 | Chen | F28D 15/0275 165/104.21 |
| 2013/0233518 | A1* | 9/2013 | Liu | F28D 15/04 165/104.26 |

FOREIGN PATENT DOCUMENTS

| | | |
|---|---|---|
| CN | 2836080 Y | 11/2006 |
| CN | 101173843 A | 5/2008 |
| CN | 201138148 Y | 10/2008 |
| CN | 201649064 U | 11/2010 |
| CN | 201660877 U | 12/2010 |
| CN | 102748971 A | 10/2012 |

* cited by examiner

INTELLIGENT TERMINAL HEAT DISSIPATION APPARATUS AND INTELLIGENT TERMINAL

CROSS-REFERENCE TO RELATED APPLICATIONS

This application is a National Stage of International Application No. PCT/CN2014/079725, filed on Jun. 12, 2014, which is hereby incorporated by reference in its entirety.

TECHNICAL FIELD

The present invention relates to heat dissipation technologies, and in particular, to a bendable intelligent terminal heat dissipation apparatus and an intelligent terminal.

BACKGROUND

A wearable terminal is an intelligent terminal product emerging after a tablet computer and a smartphone. Intelligent wearable terminals emerging in recent years include Google Glass, smart headbands, smart shoes, widely popular smart watches, and the like. Emergence of the intelligent wearable terminal indicates coming of a wearable era. However, with addition of functions such as Bluetooth, a Global Positioning System (GPS for short), a Wireless Fidelity technology (Wireless Fidelity, Wi-Fi for short), and 3rd Generation communication (Third Generation, 3G for short), generated heat of the intelligent wearable terminal increases from 0 W to more than 3 W. In addition, the generated heat of the intelligent wearable device is centralized, easily forming a partial hot area. When the intelligent wearable terminal is in contact with human skin for a long time, the intelligent wearable terminal is likely to scald the human skin. Therefore, it is necessary to control a heat generation problem of the intelligent wearable terminal, so as to quickly decrease a temperature of the intelligent wearable terminal, and avoid scalding the human skin.

Figure 1:
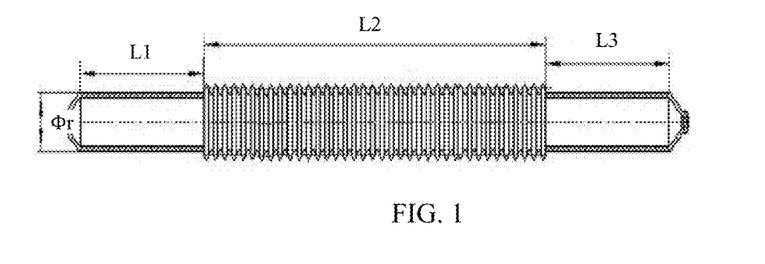
FIG. 1 is a schematic structural diagram of an existing flexible heat pipe.

At present, a flexible heat pipe is used to perform heat dissipation for a wearable terminal with a centralized heat source. The heat pipe is capable of changing a dot heat source into a line heat source, so as to reduce a risk of scaling a human body by the centralized heat source. The flexible heat pipe is bendable and is capable of performing heat dissipation in a bendable device. A structure of the flexible heat pipe is shown in FIG. 1, including an evaporation section L1, a flexible body section L2, and a condensation section L3. $\Phi r$ is a diameter of the flexible heat pipe, and the evaporation section L1 and the condensation section L3 are rigid parts of the flexible heat pipe. Heat from the evaporation section L1 of the flexible heat pipe is cooled on the condensation section L3 of the flexible heat pipe. The flexible body section L2 is a flexible part of the flexible heat pipe. When a user mounts the flexible heat pipe, the user can set a bending degree of the flexible heat pipe within a specific angle range.

However, the existing flexible heat pipe can be substantially bent only within the flexible body section L2, and other sections (the evaporation section L1 and the condensation section L3) are easily invalid after being bent and cannot perform heat dissipation for a device. An intelligent wearable terminal and a bendable smartphone have many bendable areas, and therefore, a heat dissipation effect is relatively poor when the existing flexible heat pipe is used to dissipate heat for the intelligent wearable terminal and a future bendable smartphone.

SUMMARY

The present invention provides an intelligent terminal heat dissipation apparatus and an intelligent terminal, to resolve a technical problem that a heat dissipation effect is relatively poor when an existing heat dissipation device dissipates heat for a bendable device having many bent areas.

According to a first aspect, the present invention provides an intelligent terminal heat dissipation apparatus, including:

at least one flexible heat pipe, where two ends of the flexible heat pipe are condensation ends, the middle of the flexible heat pipe is an evaporation end, the condensation end includes one or more heat pipe rigid parts and one or more heat pipe flexible parts, the one or more heat pipe rigid parts and the one or more heat pipe flexible parts of the condensation end are arranged alternately, the evaporation end includes at least one heat pipe rigid part, and an intelligent terminal body is mounted on the evaporation end.

In a first possible implementation manner of the first aspect, there are two flexible heat pipes: a first flexible heat pipe and a second flexible heat pipe, the first flexible heat pipe and the second flexible heat pipe are connected in parallel, and the intelligent terminal body is mounted on an evaporation end of the first flexible heat pipe and/or an evaporation end of the second flexible heat pipe.

In a second possible implementation manner of the first aspect, there are two flexible heat pipes: a first flexible heat pipe and a second flexible heat pipe, an evaporation end of the first flexible heat pipe and an evaporation end of the second flexible heat pipe are connected in series, and the intelligent terminal body is mounted on the evaporation end of the first flexible heat pipe and/or the evaporation end of the second flexible heat pipe.

According to the second possible implementation manner of the first aspect, in a third possible implementation manner of the first aspect, when the evaporation end of the first flexible heat pipe and the evaporation end of the second flexible heat pipe are connected in series, a first capillary structure in the first flexible heat pipe and a second capillary structure in the second flexible heat pipe are interconnected between the evaporation end of the first flexible heat pipe and the evaporation end of the second flexible heat pipe by using a third capillary structure.

According to the second possible implementation manner of the first aspect, in a fourth possible implementation manner of the first aspect, when the evaporation end of the first flexible heat pipe and the evaporation end of the second flexible heat pipe are connected in series, a first capillary structure in the first flexible heat pipe and a second capillary structure in the second flexible heat pipe are connected in parallel, multiple fourth capillary structures are disposed between the evaporation end of the first flexible heat pipe and the evaporation end of the second flexible heat pipe, and the fourth capillary structures are disposed vertically.

According to any one of the first aspect, or the first to the fourth possible implementation manners of the first aspect, in a fifth possible implementation manner, the evaporation end further includes a heat pipe flexible part, where the intelligent terminal body is mounted on the heat pipe flexible part and/or the heat pipe rigid part of the evaporation end.

According to any one of the first aspect, or the first to the fifth possible implementation manners of the first aspect, in a sixth possible implementation manner, the heat pipe flexible part includes multiple sections of pipes.

According to a second aspect, the present invention provides an intelligent terminal, where the intelligent terminal includes:

an intelligent terminal body and the intelligent terminal heat dissipation apparatus according to any one of the first aspect or the possible implementation manners of the first aspect, where the intelligent terminal body is mounted on the intelligent terminal heat dissipation apparatus.

In a first possible implementation manner of the second aspect, the intelligent terminal body is mounted on an evaporation end of the intelligent terminal heat dissipation apparatus in a top-down demountable manner; or the intelligent terminal body is mounted on an evaporation end of the intelligent terminal heat dissipation apparatus in a left-right demountable manner; or the intelligent terminal body is fastened on an evaporation end of the intelligent terminal heat dissipation apparatus.

According to the intelligent terminal heat dissipation apparatus and the intelligent terminal provided in the embodiments of the present invention, the intelligent terminal heat dissipation apparatus has condensation ends disposed on two ends of a flexible heat pipe and an evaporation end disposed in the middle of the flexible heat pipe. In addition, the condensation end includes multiple heat pipe rigid parts and multiple heat pipe flexible parts that are arranged alternately. The evaporation end includes at least one heat pipe rigid part. Therefore, flexible heat dissipation is implemented for a bendable device having many bent areas, thereby resolving a technical problem that a heat dissipation effect is relatively poor when an existing heat dissipation device dissipates heat for a bendable device having many bent areas.

BRIEF DESCRIPTION OF DRAWINGS

To describe the technical solutions in the embodiments of the present invention or in the prior art more clearly, the following briefly describes the accompanying drawings required for describing the embodiments. Apparently, the accompanying drawings in the following description show some embodiments of the present invention, and persons of ordinary skill in the art may still derive other drawings from these accompanying drawings without creative efforts.

FIG. 7b is a side view in the M-N plane direction of the schematic diagram B of a capillary structure in the intelligent terminal heat dissipation apparatus shown in FIG. 7a;

DESCRIPTION OF EMBODIMENTS

To make the objectives, technical solutions, and advantages of the embodiments of the present invention clearer, the following clearly describes the technical solutions in the embodiments of the present invention with reference to the accompanying drawings in the embodiments of the present invention. Apparently, the described embodiments are some but not all of the embodiments of the present invention. All other embodiments obtained by persons of ordinary skill in the art based on the embodiments of the present invention without creative efforts shall fall within the protection scope of the present invention.

Figure 2:
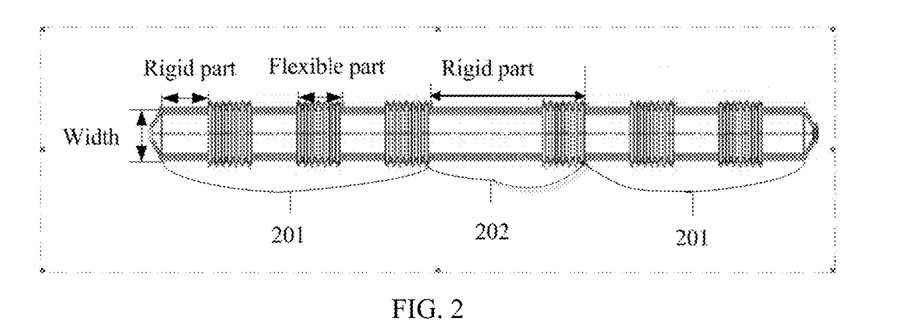
FIG. 2 is a schematic structural diagram of Embodiment 1 of an intelligent terminal heat dissipation apparatus according to the present invention.
Figure 3:
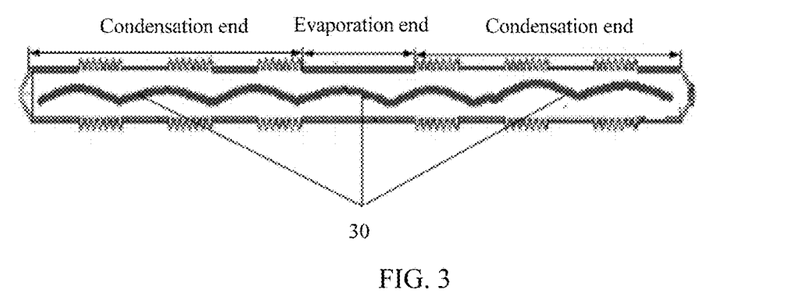
FIG. 3 is a schematic diagram of a capillary structure in the intelligent terminal heat dissipation apparatus shown in FIG. 2.

FIG. 2 is a schematic structural diagram of Embodiment 1 of an intelligent terminal heat dissipation apparatus according to the present invention. FIG. 3 is a schematic diagram of a capillary structure in the intelligent terminal heat dissipation apparatus shown in FIG. 2. In this embodiment, capillary structures in the heat dissipation apparatus are usually multiple bundles of bendable metal wires that are winded by multiple lines and that traverse a rigid part and a flexible part to form continuous capillary structures, so that a cooled liquid flows back by means of a capillary force to an evaporation end for evaporation again. In this embodiment, the intelligent terminal heat dissipation apparatus may be applied to an intelligent terminal for heat dissipation and may be further applied to a bendable intelligent wearable terminal and a further bendable smartphone for heat dissipation.

The intelligent terminal heat dissipation apparatus includes: at least one flexible heat pipe, that is, the intelligent terminal heat dissipation apparatus may include one flexible heat pipe or multiple flexible heat pipes. When an intelligent terminal body includes multiple heating devices, multiple flexible heat pipes may be used, and the multiple flexible heat pipes may be connected in parallel or in series. It should be noted that the flexible heat pipe in this embodiment may be replaced by a high heat conducting material, such as a built-in copper foil, graphite tube, or high heat conducting braided fabric, but a heat pipe is preferred. In this embodiment, when the intelligent terminal heat dissipation apparatus includes one flexible heat pipe, as shown in FIG. 2, two ends of the flexible heat pipe are condensation ends 201, and the middle of the flexible heat pipe is an evaporation end 202. The condensation ends 201 on the two ends of the flexible heat pipe may include one heat pipe rigid part and multiple heat pipe flexible parts that are arranged alternately, or multiple heat pipe rigid parts and multiple heat pipe flexible parts that are arranged alternately, or multiple heat pipe rigid parts and one heat pipe flexible part that are arranged alternately, or one heat pipe rigid part and one heat pipe flexible part that are arranged alternately. Specifically, the condensation end may be set according to a structure of an intelligent terminal related in actual application, and this is not limited in this embodiment. The evaporation end 202 in the middle of the flexible heat pipe may include only a heat pipe rigid part or may include a heat pipe rigid part and a heat pipe flexible part, and FIG. 2 shows only a rigid part of the evaporation end 202. In this embodiment, all flexible parts are formed by multiple sections of pipes. In this embodiment, as shown in FIG. 3, a capillary structure 30 is disposed in the flexible heat pipe. The capillary structure 30 is a flexible sealed device by using a vacuum design. The capillary structure 30 is filled with an evaporable liquid with a low boiling point. When the intelligent terminal body is mounted on the evaporation end 202 of the flexible heat pipe and starts to work, the evaporation end 202 of the flexible heat pipe is heated, and a liquid on the evaporation end 202 can evaporate quickly. Under a small pressure difference, vapor flows to the two condensation ends 201 of the flexible heat pipe, and releases heat and condenses into a liquid again. The liquid flows back to the evaporation end 202 by means of a capillary force of a multihole capillary material, and circulation goes on likewise, to dissipate heat for a heat source of the intelligent terminal body by means of heat conduction. In this embodiment, because the condensation end includes one or more heat pipe rigid parts and one or more heat pipe flexible parts, flexible heat dissipation can be performed for a bendable device.

According to the intelligent terminal heat dissipation apparatus provided in this embodiment of the present invention, the intelligent terminal heat dissipation apparatus has condensation ends disposed on two ends of a flexible heat pipe and an evaporation end disposed in the middle of the flexible heat pipe. In addition, the condensation end includes one or more heat pipe rigid parts and one or more heat pipe flexible parts that are arranged alternately. The evaporation end includes at least one heat pipe rigid part. Therefore, flexible heat dissipation is implemented for a bendable device having many bent areas, thereby resolving a technical problem that a heat dissipation effect is relatively poor when an existing heat dissipation device dissipates heat for a bendable device having many bent areas.

Figure 4:
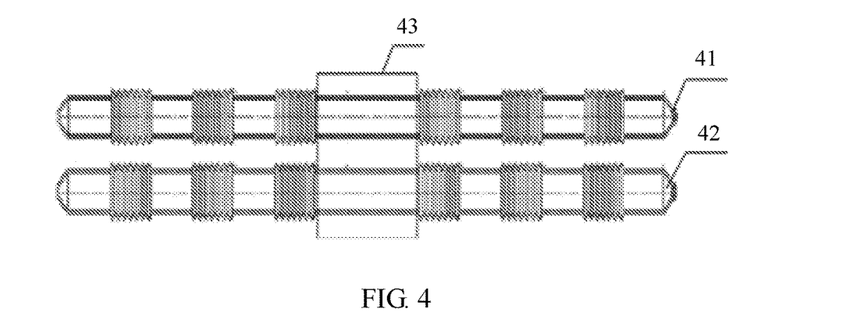
FIG. 4 is a schematic structural diagram of Embodiment 2 of an intelligent terminal heat dissipation apparatus according to the present invention.

FIG. 4 is a schematic structural diagram of Embodiment 2 of an intelligent terminal heat dissipation apparatus according to the present invention. Based on the foregoing embodiment, in this embodiment, the intelligent terminal heat dissipation apparatus includes multiple flexible heat pipes. To describe a relationship between the multiple flexible heat pipes, an example in which the intelligent terminal heat dissipation apparatus includes two flexible heat pipes is used for description in this embodiment. As shown in FIG. 4, the intelligent terminal heat dissipation apparatus includes: a first flexible heat pipe 41 and a second flexible heat pipe 42. The first flexible heat pipe 41 and the second flexible heat pipe 42 are distributed in parallel. An intelligent terminal body 43 may be mounted on an evaporation end of the first flexible heat pipe 41, or on an evaporation end of the second flexible heat pipe 42, or on an evaporation end of the first flexible heat pipe 41 and on an evaporation end of the second flexible heat pipe 42. Specifically, a mounting position may be selected according to a size of the intelligent terminal body 43. When the intelligent terminal body 43 is mounted on the evaporation end of the first flexible heat pipe 41 and the evaporation end of the second flexible heat pipe 42, the evaporation end of the first flexible heat pipe 41 and the evaporation end of the second flexible heat pipe 42 can perform heat dissipation for different heat sources of the same intelligent terminal body 43. For capillary structures in the two flexible heat pipes in this embodiment, reference may be made to distribution of the capillary structure 30 shown in FIG. 3.

Figure 5:
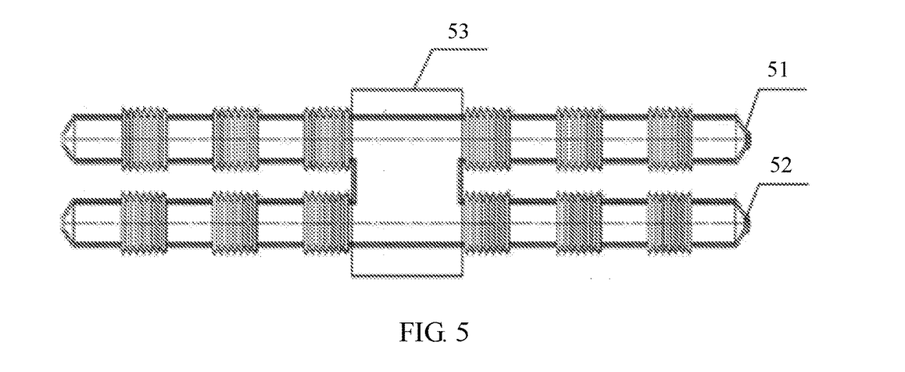
FIG. 5 is a schematic structural diagram of Embodiment 3 of an intelligent terminal heat dissipation apparatus according to the present invention.
Figure 6:
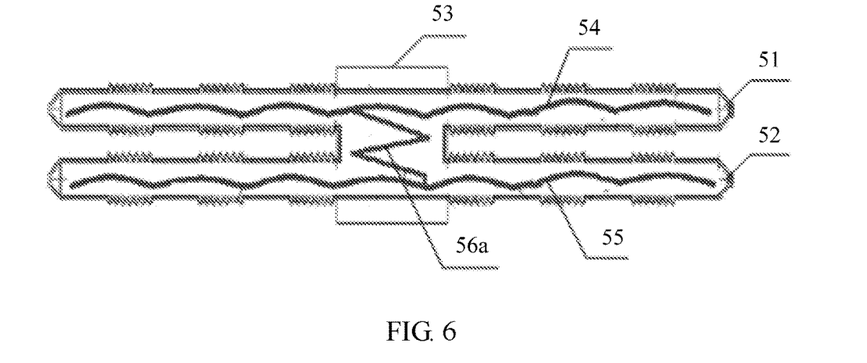
FIG. 6 is a schematic diagram A of a capillary structure in the intelligent terminal heat dissipation apparatus shown in FIG. 5.
Figure 7A:
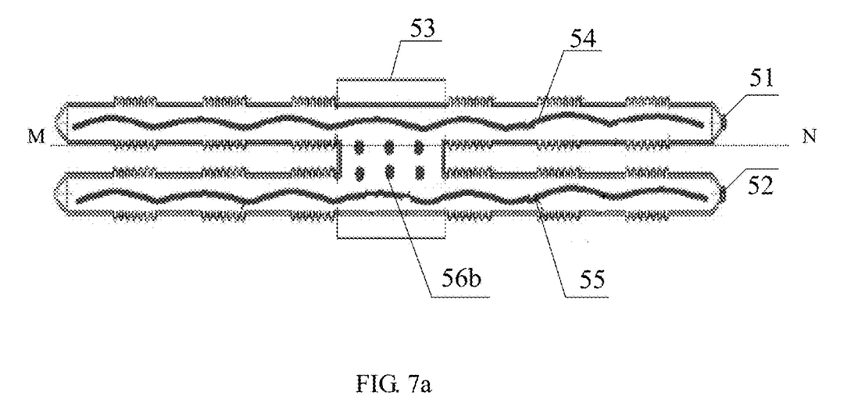
FIG. 7a is a schematic diagram B of a capillary structure in the intelligent terminal heat dissipation apparatus shown in FIG. 5.
Figure 7B:
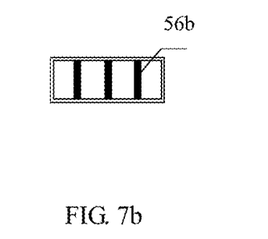

FIG. 5 is a schematic structural diagram of Embodiment 3 of an intelligent terminal heat dissipation apparatus according to the present invention. FIG. 6 is a schematic diagram A of a capillary structure in the intelligent terminal heat dissipation apparatus shown in FIG. 5. FIG. 7a is a schematic diagram B of a capillary structure in the intelligent terminal heat dissipation apparatus shown in FIG. 5. FIG. 7b is a side view in the M-N plane direction of the schematic diagram B of a capillary structure in the intelligent terminal heat dissipation apparatus shown in FIG. 7a. Based on the foregoing embodiment, in this embodiment, the intelligent terminal heat dissipation apparatus includes multiple flexible heat pipes. To describe a relationship between the flexible heat pipes, an example in which the intelligent terminal heat dissipation apparatus includes two flexible heat pipes is used for description. In this embodiment, as shown in FIG. 5, the intelligent terminal heat dissipation apparatus includes a first flexible heat pipe 51 and a second flexible heat pipe 52. An evaporation end of the first flexible heat pipe 51 and an evaporation end of the second flexible heat pipe 52 are interconnected in series, that is, the evaporation end of the first flexible heat pipe 51 and the evaporation end of the second flexible heat pipe 52 are communicated. An intelligent terminal body 53 may be mounted on the evaporation end of the first flexible heat pipe 51 and/or the evaporation end of the second flexible heat pipe 52. In this embodiment, a first capillary structure 54 in the first flexible heat pipe 51 and a second capillary structure 55 in the second flexible heat pipe 52 are shown in FIG. 6. The first capillary structure 54 and the second capillary structure 55 are interconnected by using a third capillary structure 56a at a serial connection point between the evaporation end of the first flexible heat pipe 51 and the evaporation end of the second flexible heat pipe 52. To more fully dissipate heat for devices in the intelligent terminal body 53, the third capillary structure 56a is of a mesh structure. In this embodiment, the evaporation end of the first flexible heat pipe 51 and the evaporation end of the second flexible heat pipe 52 are interconnected in series, and the first capillary structure 54 in the first flexible heat pipe 51 and the second capillary structure 55 in the second flexible heat pipe 52 are also interconnected in series. Therefore, there are more capillary structures to dissipate heat for different heat sources of the same intelligent terminal body 53, and a heat dissipation effect is improved.

Further, in this embodiment, a connection relationship between the first capillary structure 54 in the first flexible heat pipe 51 and the second capillary structure 55 in the second flexible heat pipe 52 is shown in FIG. 7a and FIG. 7b. The first capillary structure 54 and the second capillary structure 55 are connected in parallel, and multiple fourth capillary structures 56b are disposed between the evaporation end of the first flexible heat pipe 51 and the evaporation end of the second flexible heat pipe 52. The fourth capillary structures 56b are disposed vertically. That is, when the intelligent terminal body 53 is mounted on the evaporation end of the first flexible heat pipe 51 and the evaporation end of the second flexible heat pipe 52 and starts to work, a heated liquid that is on the top of the fourth capillary structure 56b and that is close to a heat source of the intelligent terminal body 53 evaporates, and vapor vertically flows to the bottom of the fourth capillary structure 56b and releases heat and condenses into a liquid again. The liquid flows back to the top of the fourth capillary structure 56b by means of a capillary force of a multihole capillary material, and circulation goes on likewise, to dissipate heat for the heat source of the intelligent terminal body 53. For a heat dissipation manner of the fourth capillary structure 56b, reference may be made to an existing cold plate heat dissipation technology.

Figure 8:
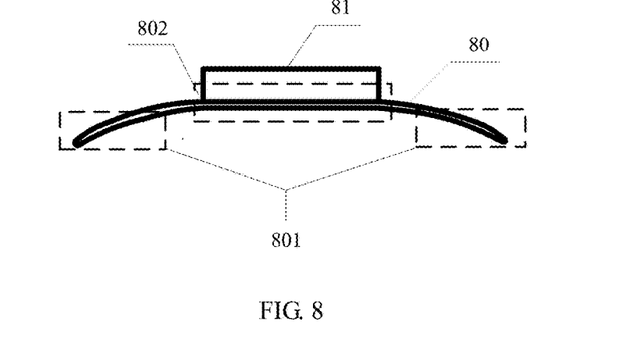
FIG. 8 is a schematic structural diagram of Embodiment 1 of an intelligent terminal according to the present invention.
Figure 9:
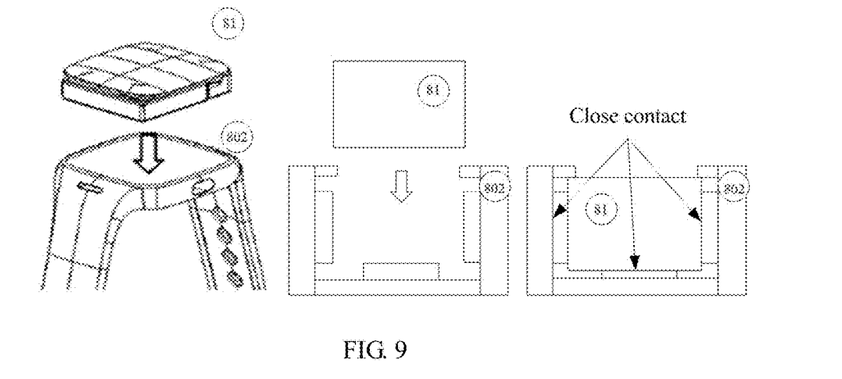
FIG. 9 is a schematic mounting diagram A of an intelligent terminal according to the present invention.
Figure 10:
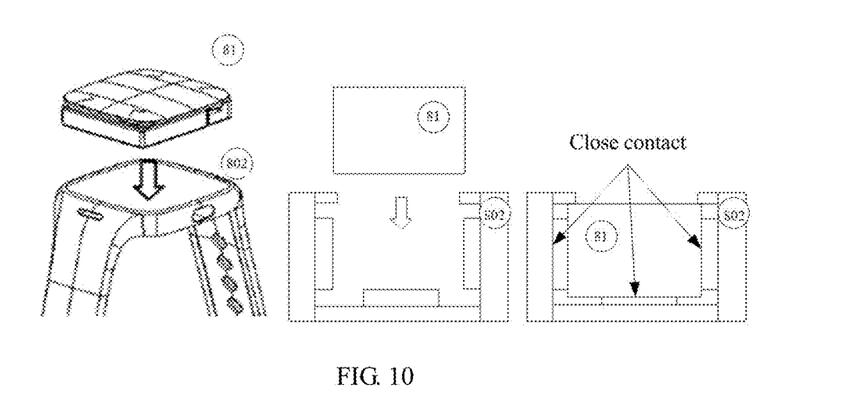
FIG. 10 is a schematic mounting diagram B of an intelligent terminal according to the present invention.

FIG. 8 is a schematic structural diagram of Embodiment 1 of an intelligent terminal according to the present invention. FIG. 9 is a schematic mounting diagram A of an intelligent terminal according to the present invention. FIG. 10 is a schematic mounting diagram B of an intelligent terminal according to the present invention. As shown in FIG. 8, the intelligent terminal includes an intelligent terminal body 81 and a mobile terminal heat dissipation apparatus 80 provided in any one of the foregoing embodiments. Two ends of the mobile terminal heat dissipation apparatus 80 are condensation ends 801 and the middle of the mobile terminal heat dissipation apparatus 80 is an evaporation end 802. The intelligent terminal body 81 is mounted on the evaporation end 802 of the mobile terminal heat dissipation apparatus 80. In this embodiment, the intelligent terminal body 81 may be mounted on the evaporation end 802 in a top-down demountable manner of a method shown in FIG. 9; or may be mounted on the evaporation end 802 in a left-right demountable manner of a method shown in FIG. 10; or the intelligent terminal body 81 may be directly fastened on the evaporation end 802. It should be noted that in this embodiment, the mobile terminal heat dissipation apparatus 80 may act as a wrist strap, a watch strap, or a lanyard of an intelligent wearable terminal, that is, a user can use a body of the intelligent wearable terminal when it is mounted on the mobile terminal heat dissipation apparatus 80.

Persons of ordinary skill in the art may understand that all or some of the steps of the method embodiments may be implemented by a program instructing relevant hardware. The program may be stored in a computer-readable storage medium. When the program runs, the steps of the method embodiments are performed. The foregoing storage medium includes: any medium that can store program code, such as a ROM, a RAM, a magnetic disk, or an optical disc.

Finally, it should be noted that the foregoing embodiments are merely intended for describing the technical solutions of the present invention other than limiting the present invention. Although the present invention is described in detail with reference to the foregoing embodiments, persons of ordinary skill in the art should understand that they may still make modifications to the technical solutions described in the foregoing embodiments or make equivalent replacements to some technical features thereof, without departing from the scope of the technical solutions of the embodiments of the present invention.

What is claimed is:

1. An intelligent terminal heat dissipation apparatus comprising:
    at least one flexible heat pipe, wherein two ends of the flexible heat pipe are condensation ends, the middle of the flexible heat pipe is an evaporation end, each of the condensation ends comprises one or more heat pipe rigid parts and one or more heat pipe flexible parts, the one or more heat pipe rigid parts and the one or more heat pipe flexible parts of each condensation end are arranged alternately, the evaporation end comprises at least one heat pipe rigid part, and an intelligent terminal body is mounted on the evaporation end; and
    a capillary structure disposed continuously through the at least one flexible heat pipe, wherein the capillary structure is a flexible sealed device using a vacuum design filled with an evaporable liquid having a low boiling point.

2. The apparatus according to claim 1, wherein there are two flexible heat pipes: a first flexible heat pipe and a second flexible heat pipe, the first flexible heat pipe and the second flexible heat pipe are connected in parallel, and the intelligent terminal body is mounted on an evaporation end of the first flexible heat pipe and/or an evaporation end of the second flexible heat pipe.

3. The apparatus according to claim 1, wherein there are two flexible heat pipes: a first flexible heat pipe and a second flexible heat pipe, an evaporation end of the first flexible heat pipe and an evaporation end of the second flexible heat pipe are connected in series, and the intelligent terminal body is mounted on the evaporation end of the first flexible heat pipe and/or the evaporation end of the second flexible heat pipe.

4. The apparatus according to claim 3, wherein when the evaporation end of the first flexible heat pipe and the evaporation end of the second flexible heat pipe are connected in series, a first capillary structure in the first flexible heat pipe and a second capillary structure in the second flexible heat pipe are interconnected between the evaporation end of the first flexible heat pipe and the evaporation end of the second flexible heat pipe by using a third capillary structure.

5. The apparatus according to claim 3, wherein when the evaporation end of the first flexible heat pipe and the evaporation end of the second flexible heat pipe are connected in series, a first capillary structure in the first flexible heat pipe and a second capillary structure in the second flexible heat pipe are connected in parallel, multiple fourth capillary structures are disposed between the evaporation end of the first flexible heat pipe and the evaporation end of the second flexible heat pipe, and the fourth capillary structures are disposed vertically.

6. The apparatus according to claim 1, wherein the evaporation end further comprises:
    a heat pipe flexible part, wherein the intelligent terminal body is mounted on the heat pipe flexible part and/or the heat pipe rigid part of the evaporation end.

7. The apparatus according to claim 1, wherein the heat pipe flexible part comprises multiple sections of flexible pipes.

8. An intelligent terminal comprising:
    an intelligent terminal body and an intelligent terminal heat dissipation apparatus, wherein the intelligent terminal heat dissipation apparatus comprises:
    at least one flexible heat pipe, wherein two ends of the flexible heat pipe are condensation ends, the middle of the flexible heat pipe is an evaporation end, each of the condensation ends comprises one or more heat pipe rigid parts and one or more heat pipe flexible parts, the one or more heat pipe rigid parts and the one or more heat pipe flexible parts of each condensation end are arranged alternately, the evaporation end comprises at least one heat pipe rigid part; and
    a capillary structure disposed continuously through the at least one flexible heat pipe, wherein the capillary structure is a flexible sealed device using a vacuum design filled with an evaporable liquid having a low boiling point;
    wherein the intelligent terminal body is mounted on the evaporation end of intelligent terminal heat dissipation apparatus.

9. The intelligent terminal according to claim 8, wherein the intelligent terminal body is mounted on the evaporation end of the intelligent terminal heat dissipation apparatus in a detachable manner.

10. The intelligent terminal according to claim 8, wherein the intelligent terminal body is fastened on the evaporation end of the intelligent terminal heat dissipation apparatus.

\* \* \* \* \*